April 21, 1959 M. AUWÄRTER 2,883,305

PHOTOELECTRIC SEMICONDUCTORS AND METHOD OF PRODUCING SAME

Filed Sept. 21, 1951

The Inventor:

Max Auwärter

United States Patent Office 2,883,305
Patented Apr. 21, 1959

2,883,305

PHOTOELECTRIC SEMICONDUCTORS AND METHOD OF PRODUCING SAME

Max Auwärter, Balzers, Liechtenstein

Application September 21, 1951, Serial No. 247,705

Claims priority, application Switzerland September 27, 1950

22 Claims. (Cl. 117—200)

Figure 1:
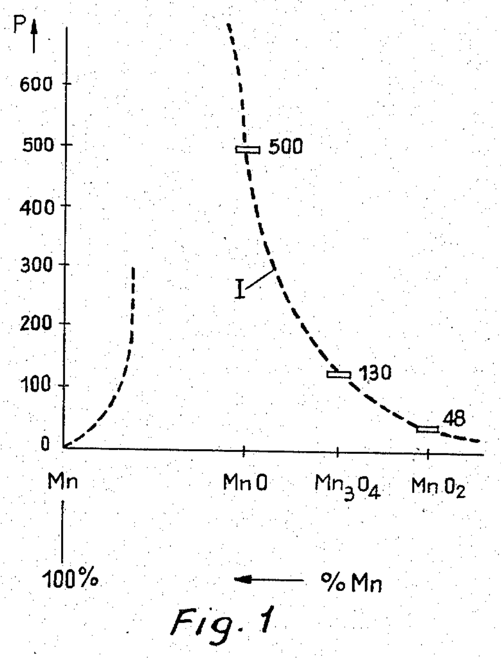

This invention relates particularly to semiconductors suitable for photoelectrical purposes and to methods of producing them.

Photoelectric elements operating as blocking layer elements without auxiliary voltage have a semiconductor layer, in which the incidence of light liberates weakly bonded electrons, which drift as carriers of the so-called photoelectric current into an outer circuit connected by means of electrodes. The efficiency of the photoelectric effect, consisting in the conversion of the incident light energy into electric energy, depends to a high degree on the type of semiconductor of the photoelectric element itself. Experimental measurements have shown that in semiconductors consisting of binary cation-anion compounds the photoelectric effect increases with the proportion of the metal component, that is, of the cation component, in the chemical compound.

In accordance with the classic law of constant multiple proportions two components enter into a chemical compound always in certain stoichiometric proportions, which depend on the valence of the elements. In accordance with this law the proportion of the metal component to the non-metal component in a semiconductor compound is limited. For this reason the photoelectric effect in the previously known semiconductor compounds is limited by the stoichiometric proportion and, possibly, by its statistic fluctuations.

The same applies to the so-called photoelectric resistors, in which a semiconductor layer to which a potential is applied from the outside alters its electric resistance in dependence in the incident light. In this case one may also speak of a photoelectric effect.

This invention has as its object to obtain a substantial increase in the photoelectric effect or in the photoelectric resistance effect beyond what has been achieved so far, by a semiconductor which consists of a solid solution containing a metal component and a non-metal component in a proportion which is intendedly non-stoichiometric and outside the statistic fluctuations, the solid solution containing more of the metal component than corresponds to the stoichiometric proportion of that previously known chemical compound of the same component which is least saturated with a non-metal component.

Embodiments of the invention will be explained hereinafter by way of example.

To facilitate understanding the invention, the accompanying drawings show results of measurement obtained from different photoelectric elements.

Figs. 1 to 4 showing the photoelectric effect of semiconductors of metal and non-metal components of different composition.

So far three manganese oxides are known, viz., $MnO_2$, $Mn_3O_4$, and MnO, all of which exhibit the photoelectric effect. The photoelectric currents measured in these compounds under equal conditions have been plotted in Fig. 1, in the said order and they amount to 48, 130, and 500 units, respectively. As the proportion of the metal component in the compound increases so does the photoelectric current produced. The pure metal, however, shows no photoelectric effect at all.

Leaving out of consideration substances having metallic conductivity, chemical compounds are insulators if, from the chemical point of view, they are exactly stoichiometrically constituted, and if, from the physical standpoint, they do not show any disorder in their crystal lattice. On the other hand, semi-conductors, from the chemical point of view, are still compounds which are stoichiometrically constituted, while physical examination shows that the lattice structure is disturbed; this is called a defective lattice. When in a diagram the metal content of chemical compounds with defective lattices which come into consideration as semi-conductors, is plotted as abscissae in atom percentages, while the ordinates indicate the magnitude of the photoelectric effect of such semi-conductors, it will be seen that the photoelectric effect of the strictly stoichiometric compound is zero. With increasingly defective lattice, the photoelectric effect increases from such zero point in both directions to a maximum and then when the lattice disorder exceeds a certain point, decrease again to zero. These two maxima, which occur at certain very small deviations from the exact stoichiometric ratios, increase in the case of metal compounds whose metallic constituent has plural valences and so is capable of forming two or more stoichiometric compounds with the same non-metallic anion, as the valence of the metal in the stoichiometric compound decreases.

When the three points of measurement in Fig. 1 are connected by a line, a curve results which rises steeply toward the axis of ordinates drawn through the point coordinated with the pure metal. This curve must drop to zero toward the point corresponding to the pure metal because, as has been mentioned, the pure metal gives no photoelectric effect. Obviously the curve I must go through a maximum between the two abscissas coordinated with the known substances Mn and MnO.

Figure 2:
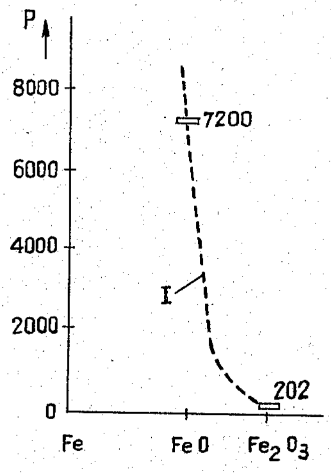
Figure 3:
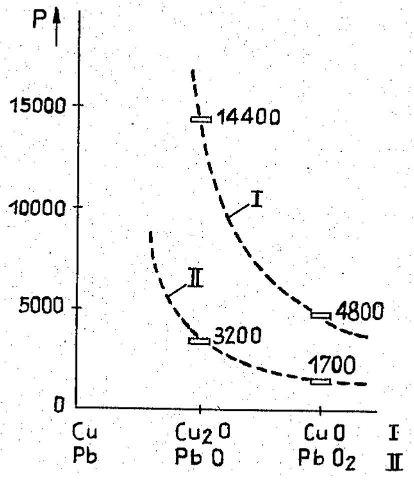
Figure 4:
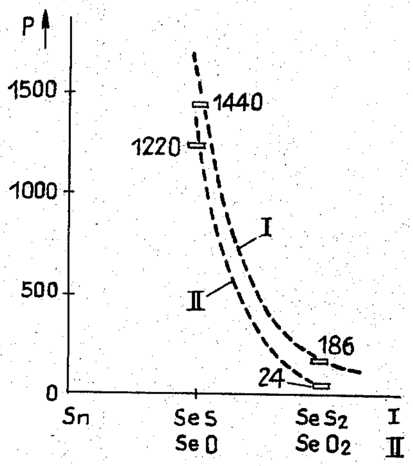

Similar curves are found for other semiconductors exhibiting the photoelectric effect, as is shown in Figs. 2 to 4 for iron oxides, copper oxides, lead oxides, selenium oxides, and selenium sulphides. The ordinates of the curves always correspond to the photoelectric currents measured under equal conditions.

If in accordance with the invention the semiconductor, e.g., of a photoelectric cell, is made not from an intimately mingled deposit or chemical compound of stoichiometric composition but from a solid solution containing a metal component and a non-metal component in an intendedly non-stoichiometric proportion, the solid solution containing more of the metal component than corresponds to the stoichiometric proportion of that known chemical compound of the same component which is least saturated with a non-metal component, the curves will show for that semiconductor substantially higher photoelectric currents than previously under the same conditions. Applied to the example of compounds of manganese with oxygen, this means that the semiconductor of the improved photoelectric element must be made, e.g., from $MnO_x$, where $x$ is less than 1. The content of the metal component in such a solid solution is larger than accordingly to the stoichiometric proportion of the compound MnO, which has the largest metal proportion of the previously known metal oxides.

Very high photoelectric currents are obtained in semiconductors of this kind, in which the metal component consists of titanium, zirconium, or copper, and in which the non-metal component consists of or contains oxygen. For example, $CuO_x$, $TiO_y$, and $ZrO_z$ give good results, when $x$ is less than 0.5, $y$ is less than 1, and $z$ is less than 2.

The semi-conductor layers employed for the improved photoelectric elements of the present invention can be produced by various methods. For example, they may be produced by evaporating the metal titanium and an oxide of titanium such as $TiO_2$, simultaneously in a high vacuum from two different sources of evaporation. The condensate formed on a backing introduced into the receiver is a solid body composed of the elements Ti and O, the ratio of the elements depending on the temperature, on the evaporation temperature of the individual substances, etc. In this manner, it is possible to produce $TiO_y$, wherein $y$ is smaller than 1, the condensate being in the form of a stable solid solution.

Suitably the thus obtained semiconductor layer is subjected for artificial ageing to achieve a favorable phase condition to a subsequent temperature treatment.

Another possibility of producing such solid solutions in intendedly non-stoichiometric proportions is based on the discovery that when metal compounds are evaporated in a high vacuum the condensate deposited is always disproportionate, showing, e.g., in the case of oxygen compounds a loss of oxygen as compared with the stoichiometric compounds. This disproportionateness increases with the evaporation temperature. E.g., the evaporation of FeO at very high temperatures leads to a condensate $FeO_x$, where $x$ is smaller than 1. The mixed phases obtained are perfectly stable and durable; in particular, the condensate no longer oxidizes in ordinary atmospheric air.

A third process for producing electric semiconductors having components in non-stoichiometric proportions consists in that pure metal, such as titanium, is applied on the backing by cathode sputtering in an oxygen atmosphere of a low partial pressure. When the oxygen is present under so small a partial pressure that the oxygen required to form a stoichiometric compound is not available, so that there is a lack of oxygen, the resulting condensate is a solid solution poor in oxygen, or rich in metal, such as TiO. Instead of oxygen another gas atmosphere may be used, containing or consisting of, e.g., nitrogen or hydrogen, if the components to form the anions of the solid solution, that is, the gas atmosphere, is under a low partial pressure.

The solid solution obtained by any of the said and other methods has in its crystal lattice an extremely large number of points of disorder, that is, of points not occupied by oxygen ions. Moreover, additional metal ions may occupy interstitial positions in the lattice. These points of disorder lead to a surprisingly high photoelectric effect, which is reduced only, but with extreme rapidity, if the composition of the solid solution approaches the pure metal condition.

Similarly as in the case of double salts, the cations, that is, the metal components of the solid solution, may consist of different metal elements. The same applies to the anion-forming non-metal elements, primarily to the gases mentioned hereinbefore.

What I claim is:

1. A photoelectric semiconductor for use in photoelectric devices for converting incident rays into electric currents, said semiconductor comprising a backing having thereon a coating composed of a metal and a nonmetal which form compounds having a photoelectric effect, said coating comprising a solid solution of the metal in a lattice-defective compound of the metal and non-metal in which the metal has its lowest valence, the total content of the metal in said solid solution being greater than in said lattice-defective compound, said solution having a substantially greater photoelectric effect than a coating consisting solely of said lattice-defective compound of the metal and non-metal.

2. A photoelectric semiconductor as defined in claim 1, wherein the metallic component is titanium.

3. A photoelectric semiconductor as defined in claim 1, wherein the non-metallic component is oxygen.

4. A photoelectric semiconductor as defined in claim 1, wherein the metallic component is titanium and the non-metallic component is oxygen.

5. A photoelectric semiconductor as defined in claim 1, wherein the metallic component consists of a plurality of metals.

6. A photoelectric semiconductor as defined in claim 1, wherein the non-metallic component is a gas.

7. A photoelectric semiconductor as defined in claim 1, wherein the non-metallic component consists of a plurality of gases.

8. A photoelectric semiconductor as defined in claim 1, wherein the metallic component is titanium, and the non-metallic component is a gas.

9. A photoelectric semiconductor as defined in claim 1, wherein the metallic component is titanium, and the non-metallic component consists of a plurality of gases.

10. A photoelectric semiconductor as defined in claim 1, wherein the metallic component consists of a plurality of metals, and the non-metallic component consists of a gas.

11. A photoelectric semiconductor as defined in claim 1, wherein the metallic component consists of a plurality of metals, and the non-metallic component consists of a plurality of gases.

12. Method for the manufacture of photoelectric semiconductors composed of a metal and a non-metal which form compounds having a photoelectric effect, which comprises depositing on a backing a solid solution of the metal in a compound of the metal and non-metal, and adjusting the content of the metallic component in said solid solution to a ratio greater than the ratio of the metallic component in that lattice-defective compound of the metallic and non-metallic components in which the metallic component has its lowest valence.

13. Method as defined in claim 12, wherein said adjustment is effected by evaporating the metallic element, simultaneously evaporating a compound of the same metallic component with the non-metallic component and condensing a mixture of said vapors on the backing to form the photoelectric semiconductor.

14. Method as defined in claim 12, wherein said adjustment is effected by evaporating the metallic element, simultaneously evaporating that compound of the metallic and non-metallic components in which the metallic component has its lowest valence, and condensing a mixture of said vapors on the backing to form the photoelectric semiconductor.

15. Method according to claim 12, wherein said adjustment is effected by evaporating the metallic element, simultaneously evaporating a compound of the same metallic component with the non-metallic component, maintaining temperatures which are considerably above the highest vaporization temperature, and condensing a mixture of said vapors on the backing to form the photoelectric semiconductor.

16. Method according to claim 12, wherein said adjustment is effected by providing an atmosphere of the non-metallic element, evaporating a metallic element in said atmosphere, reducing the partial pressure of the atmosphere below the pressure at which said metallic element combines with said non-metallic element into a solid solution, and condensing said vapors on the backing to form the photoelectric semiconductor.

17. Method according to claim 12, wherein said adjustment is effected by providing an atmosphere of the non-metallic element, dispersing a metallic element in said atmosphere, reducing the partial pressure of the atmosphere below the pressure at which said metallic element combines with said non-metallic element into a solid solution, and precipitating the dispersion on the backing to produce the photoelectric semiconductor.

18. Method according to claim 12, wherein said adjustment is effected by providing an atmosphere of the non-metallic element, cathodically dispersing a metallic element in said atmosphere, reducing the partial pressure of the atmosphere below the pressure at which said metallic element combines with said non-metallic element to a solid solution, and precipitating the dispersion on the backing to produce the photoelectric semiconductor.

19. Method according to claim 12, including the step of ageing the produced semiconductor at elevated temperatures.

20. Method for the manufacture of photoelectric semiconductors, which comprises depositing a solid solution of titanium and a non-metallic component on a backing, and adjusting the content of titanium in said solution to a ratio greater than the maximum ratio of titanium in that lattice-defective titanium compound of the non-metallic component in which the titanium has its lowest valence.

21. Method for the manufacture of photoelectric semiconductors which comprises depositing a solid solution of a metallic component and oxygen on a backing, and adjusting the content of the metallic component in said solid solution to a ratio greater than the maximum ratio of the metal component in that lattice-defective oxygen compound of said metallic component in which the metallic component has its lowest valence.

22. Method for the manufacture of photoelectric semiconductors which comprises depositing a solid solution of titanium and oxygen on a backing, and adjusting the content of titanium in said solid solution to a ratio greater than the maximum ratio of titanium in that lattice-defective titanium-oxygen compound in which titanium has its lowest valence.

References Cited in the file of this patent

UNITED STATES PATENTS

| | | |
|---|---|---|
| 2,077,442 | Tedham | Apr. 20, 1937 |
| 2,081,894 | Meyer et al. | May 25, 1937 |
| 2,496,346 | Haayman et al. | Feb. 7, 1950 |
| 2,507,233 | Verwey | May 9, 1950 |
| 2,539,149 | Miller | Jan. 23, 1951 |
| 2,583,732 | Ericsson et al. | Jan. 29, 1952 |
| 2,692,212 | Jenkins et al. | Oct. 19, 1954 |
| 2,695,380 | Mayer et al. | Nov. 23, 1954 |
| 2,699,522 | Breckenridge | Jan. 11, 1955 |

OTHER REFERENCES

Rentschler et al.: "Lowering of the Photoelectric Work Function of Zirconium, Titanium, Thorium and Similar Metals of Dissolved Gases," Transactions of the Electrochemical Society, vol. 87, 1945, pp. 289–297.